United States Patent

[11] 3,567,894

[72] Inventor Helmuth Spreitzer
Zurich, Switzerland
[21] Appl. No. 830,056
[22] Filed June 3, 1969
[45] Patented Mar. 2, 1971
[73] Assignee Contraves A G
Zurich, Switzerland
[32] Priority Mar. 11, 1969
[33] Switzerland
[31] 3609/69

[54] HOUSING EQUIPPED WITH CIRCUIT BOARD FOR ELECTRICAL SWITCH MECHANISM
4 Claims, 6 Drawing Figs.

[52] U.S. Cl. .......... 200/168, 200/11, 200/166
[51] Int. Cl. .......... H01h 9/02
[50] Field of Search .......... 200/11 (TW), 168 (G), 168 (S), 166 (CPC), 166.1

[56] References Cited
UNITED STATES PATENTS
3,306,993 2/1967 Lien .......... 200/11(TW)

*Primary Examiner*—H. O. Jones
*Attorney*—Werner W. Kleeman

ABSTRACT: A novel housing is disclosed, the housing having at least one stationary circuit board for an electrical switch or other device therein. Current conducting tracks leading to contact ends are disposed in the plane of the stationary circuit board, such contact ends being arranged along a housing wall disposed transverse to the plane of the circuit board. Connecting pin members having connection legs which are flexed toward the circuit board extend transversely through the housing wall and are mechanically retained therein. The flexed connection legs of the connecting pin members pass through the circuit board in each instance at the region of the contact ends of the current conducting tracks and are electrically and mechanically connected therewith.

INVENTOR
HELMUTH SPREITZER
BY Jacobi, Davidson & Kleeman
ATTORNEYS

INVENTOR
HELMUTH SPREITZER

BY Jacobi, Davidson & Kleeman

ATTORNEYS

HOUSING EQUIPPED WITH CIRCUIT BOARD FOR ELECTRICAL SWITCH MECHANISM

BACKGROUND OF THE INVENTION

The instant invention generally relates to housings and particularly concerns an improved housing of the type having at least one stationary circuit board for an electrical switch or other type of electrical apparatus in the plane of which current conducting tracks leading to contact ends are disposed, such contact ends being arranged along a housing wall situated transverse to the plane of the circuit board or plate.

With prior-art constructions, housings of the type above-mentioned having circuit plates or boards normally were such that the ends of the circuit boards protruded past the rear of the housing. The protruding ends of the circuit boards having the conductor tracks were constructed to be inserted in the connection plugs. With still other prior-art embodiments, the terminal connections were directly soldered with the ends of the conductor tracks. Yet, in all of the known constructions, the actual connections are disposed in the plane of the circuit board of plate itself.

SUMMARY OF THE INVENTION

It is a primary object of the present invention to provide an improved housing of the type equipped with a circuit board wherein it is possible to increase the mutual spacing of the input and output connections to the circuit board yet maintain constant external dimensions of the housing and the circuit board itself.

Further objects of the instant invention are the provision of an improved housing wherein the number of input and output connections to the circuit board is substantially increased without a corresponding increase in housing size.

Now, in order to implement these and still further objects of the invention which will become more readily apparent as the description proceeds, the housing comprising the instant invention is manifested by the features that a connection pin member passing through the above-mentioned housing wall disposed transverse to the plane of the circuit board or plate and mechanically retained therein, is also mechanically and electrically connected with the respective contact end of a current conducting track disposed in the plane of the circuit board.

The inventive housing incorporating connection pins as described now makes it possible to have an arrangement of the input-output connections with a larger mutual spacing yet with unchanged housing dimensions. This is in definite contrast to the known embodiments of housings of this type. This feature is particularly advantageous and desirable in those instances where the connections to the connection pins are mechanically undertaken by means of the so-called Termipoint or Wirewrap process. Preferably the connection pins are inserted into the housing wall and are flexed or bent toward the circuit board internally of the housing to provide connection legs. The ends of the flexed connection leg members pass through the circuit board and are connected thereto always at the region of a conductor track contact end. Furthermore, the connection pins are advantageously inserted in two parallel rows within the housing rear wall in such a manner that when constructing a switching module, i.e., an in-line arrangement containing a number of housings in a single package, all of the connection pin rows of the housings have the same spacing from one another. Consequently, the contact ends of the conductor tracks on the circuit board can likewise be disposed in two rows. The flexed connection leg members of the connection pins in the first row would be connected with the outer row of contact ends and a correspondingly longer flexed connection leg of the connection pin of the second row would be connected with the inner row of contact ends.

BRIEF DESCRIPTION OF THE DRAWINGS

The invention will be better understood and objects other than those set forth above will become apparent when consideration is given to the following detailed description thereof. Such description makes reference to the annexed drawings wherein.

DESCRIPTION OF THE PREFERRED EMBODIMENTS

Figure 1:
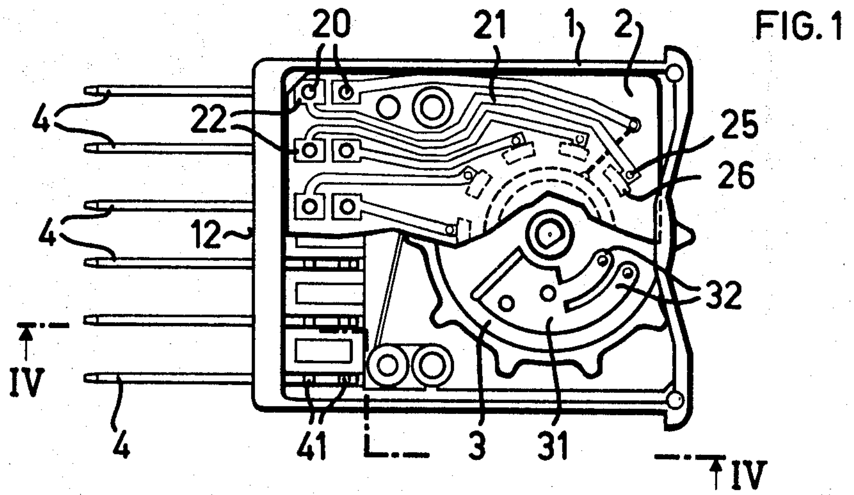
FIG. 1 depicts a side elevational view of an inventive embodiment of a housing utilized for a multipositional selector switch.

Describing now the drawings, particular reference is made to FIG. 1. In FIG. 1, an exemplary embodiment of the inventive housing of the switch is depicted for use in a multipositional selector switch, for example. The housing 1 is closed at one side by a circuit board or plate 2 provided with current conductor tracks or segments 21. Furthermore, a rotary wiper switch means 31 having contact fingers 32 is rigidly connected for rotation with a switching wheel 3. Conductor tracks 21 have switching ends 26 which are disposed at different sides of the circuit board 2 and are electrically coupled with one another via the through-plated or clad boxes 25.

The rotary wiper switch means 31 serve to couple appropriate conductor tracks 21 electrically with one another in accordance with a predetermined code for each position of the switching wheel 3. Further, it should be recognized that metallic connection pin members 4 are inserted in the rear wall 12 of the housing 1. The ends 41 of the connection pin member 4 define connection legs disposed within housing 1 and are flexed or bent and inserted in bores 20 of contact ends 22 of the conductor tracks 21. Such contact ends 22 may, for example, be arranged in two rows as illustrated. The ends 41 of the connection legs can be, for example, soldered with the contact ends 22.

Figure 2:
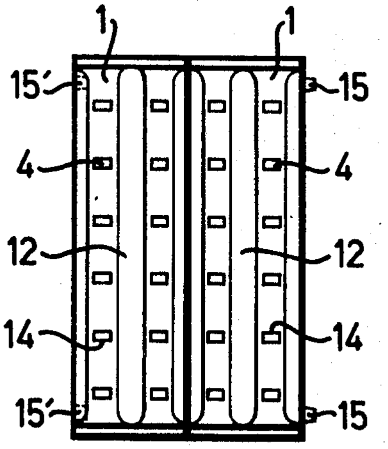
FIG. 2 depicts a rear view of two housings of the type shown in FIG. 1, such housings being placed in-line with one another or stacked against one another into a single package or module.

Referring now to FIG. 2, there is illustrated in detail the rear of two housings 1 which are placed in-line, in other words in side-by-side relationship, into a single package or module. Positioning cams 15 provided at one side of the housing 1 and appropriate recesses 15' provided at the opposite side of the housing 1 permit effortless side-by-side mounting of a plurality of such housings 1. The connection pin members 4 are inserted in two respective rows and through appropriate recesses 14 of the rear wall 12 of the housing. The plurality of connection pin members 4, when such housings are placed in-line, define a grid having columns and lines with a respective equal spacing from one another, as illustrated.

Figure 3:
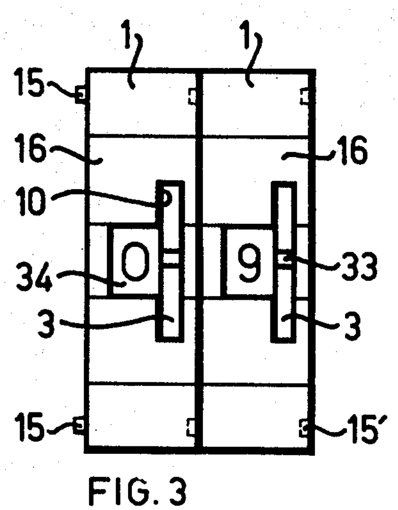
FIG. 3 depicts a front view of two housings of the type depicted in FIG. 1, such housings being placed in-line adjacent one another as explained above.

Referring now to FIG. 3, a front view of two housings 1 which are placed in side-by-side relationship is depicted. For each switching position of switching wheel 3, an actuation cam 33 provided at switching wheel 3 extends outwardly through the associated recess 10 provided at the front face or side 16 of corresponding housing 1. Numbers are conveniently provided at a ring member 34 of the switching wheel 3 so as to be able to readily ascertain each switching position of switching wheel 3. These numbers are visible through the recess opening 10 of the corresponding housing 1, as the switching wheel is appropriately rotated or indexed.

Figure 4:
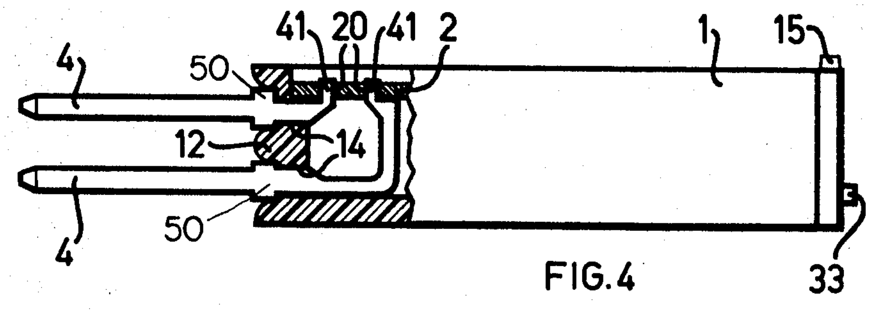
FIG. 4 depicts a sectional view of the housing of the multipositional selector switch arrangement shown in FIG. 1, such view being taken substantially along the line IV–IV thereof.

FIG. 4 illustrates a sectional view of the multipositional arrangement depicted in FIG. 1, the section being taken along the line IV–IV thereof. As can be seen, connection pin members 4 are arranged in two rows in a correspondingly shaped through-passage opening 14 provided at the rear wall 12 of housing 1. The connection legs of the connection pin members 4 are situated in the housing 1 and are flexed or bent and inserted with their ends 41 into bores 20 of the contact end of conductor tracks 21. Further, each connection pin member is advantageously provided with cam means 50 which bear against the outside surface of the rear housing wall 12 and serve to fixedly position and arrest each inserted connection pin member.

Figure 5:
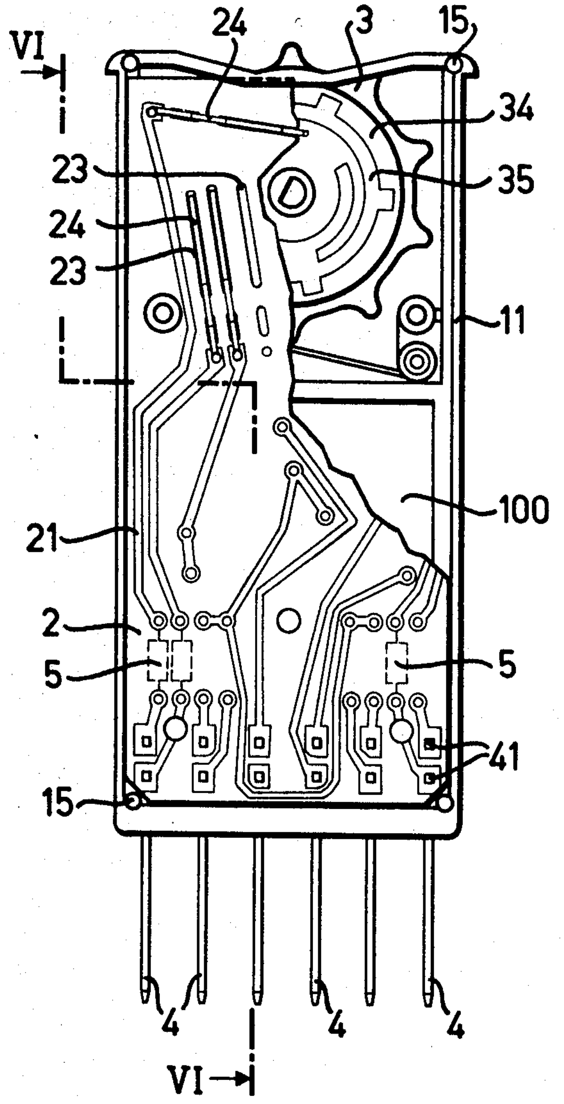
FIG. 5 depicts a side view of a housing for a multipositional selector switch of the type containing electronic components.

Referring now to FIG. 5, a side elevational view of a further preferred embodiment of a housing particularly suitable for multipositional selector switch arrangements is illustrated. In this embodiment, the housing 11 is extended or lengthened at its rear side or portion thereof. The circuit board 2 is likewise enlarged and upon the circuit board 2 conductor tracks 21 are provided which may be equipped with electronic components 5 appropriately arranged thereon. The electronic components 5 are accommodated in the space or compartment 100 which is made available due to the enlargement of the housing 11 as previously explained. The connection of the connection pin members 4 with the conductor tracks 21 is undertaken in the same manner in this embodiment as previously explained in conjunction with the arrangements of FIGS. 1 to 3. Furthermore, in this embodiment, contact spring members 24 are mounted in slots 23 of the circuit board 2 and are coupled with conductor tracks 21. Additionally, a circular disc-shaped switch plate 34 which carries a contact track 35 is rigidly connected for rotation with switching wheel 3. Contact track 35, for each switching position, serves to electrically couple appropriate contact springs 24 with one another.

Figure 6:
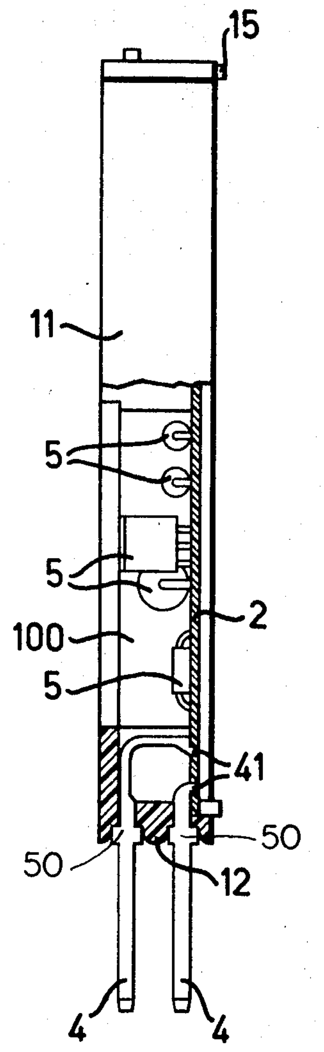
FIG. 6 depicts a sectional view of the housing arrangement shown in FIG. 5, such view being taken substantially along the line VI–VI thereof.

FIG. 6 depicts a sectional view of the arrangement of FIG. 5, such view being taken substantially along the line VI–VI thereof. In the space or compartment 100 obtained by extending or enlarging the housing 11, electronic components 5 are arranged, such components being coupled with appropriate conductor tracks 21 of the circuit board 2. The connection pins 4 which are arranged in two rows are inserted in the rear wall 12 of the housing. The ends 41 of the connection legs of the connection pins 4 are situated within the housing 11 and are connected with the conductor tracks 21 of the circuit board 2 in the manner above-described.

Connector pin members 4 serve, for example, as insertion members for insertion into an appropriate connector plug or socket. It is possible, however, to connect the connector pins 4 with connection wires by means of the so-called Termipoint or Wirewrap technique which presupposes a minimum spacing of connector pins 4. When this is done, the positioning cam means 50 provide, both for this embodiment as well as for the embodiment of FIGS. 1 to 3, the notable advantage of transmitting to the rear housing wall 12 the rather considerable forces applied in the lengthwise direction of the connection pin members 4 during application of the connection wires. The housings 1 and 11, respectively, can be fabricated from suitable plastic material which preferably can be rendered inflammable or combustible only with great difficulty. It is further possible to provide retaining spring members at the housings so as to secure individual apparatus or a number of apparatus grouped together into a package in some device. Furthermore, connection pin members 4 can also be cast or molded at the housing rear wall 12.

It should now be apparent from the foregoing description that the objects set forth at the outset to the specification, have been successfully achieved.

I claim:

1. A housing for an electrical switch comprising at least one stationary circuit board, current conductor tracks having contact ends disposed substantially in the plane of said circuit board, said contact ends arranged along a housing wall disposed transverse to the plane of said circuit board, said housing wall provided with through-passage openings, two parallel rows of connector pin members inserted through said through-passage openings of said housing wall and arranged in such manner that when similar housings are placed in a row adjacent to one another all of the connector pin member rows have the same spacing from one another, said connector pin members internally of the housing providing connector legs flexed towards said circuit board, said connector legs having ends which pass through said circuit board and are connected therewith at the region of a respective contact end of an associated current conductor track, said connector pin members including means for fixedly positioning and arresting the inserted connector pin members at said housing wall.

2. A housing as defined in claim 1, wherein said means for fixedly positioning and arresting the inserted connector pin members at said housing wall comprises a cam member provided for each connector pin member bearing against the outside surface of said housing wall.

3. A housing as defined in claim 1, wherein said contact ends are arranged along said housing wall in an inner and an outer row, one of said parallel rows of connector pin members having connector legs leading to said outer row of contact ends, the other of said parallel rows of connector pin members having longer connector legs leading to said inner row of contact ends.

4. A housing construction for an electrical switching mechanism comprising an elongate hollow housing body, at least one stationary circuit board disposed within said hollow housing body, current conductor tracks having contact ends disposed substantially in the plane of said circuit board, said hollow housing body including a housing wall extending transverse to the plane of said circuit board, said contact ends disposed at the region of said housing wall, said housing wall provided with through-passage openings for connector pin members, two parallel rows of connector pin members inserted through said through-passage openings of said housing wall to provide a substantially gridlike configuration, said two parallel rows of connector pin members arranged such that when similar housing constructions are placed in a row adjacent to one another all of the connector pin member rows possess substantially the same spacing from one another, said connector pin members internally of said housing wall providing connector legs flexed towards said circuit board, said contact ends of said circuit board arranged along said housing wall in an inner and an outer row, one of said parallel rows of connector pin members having connector legs leading to and connected with said outer row of contact ends, the other of said parallel rows of connector pin members having longer connector legs leading to and connected with said inner row of contact ends, each of said connector pin members provided with cam means for fixedly positioning and arresting the inserted connector pin members at said housing wall and for transmitting forces applied to said connector pin members to said housing wall.